(12) United States Patent
Chen et al.

(10) Patent No.: US 6,383,943 B1
(45) Date of Patent: May 7, 2002

(54) PROCESS FOR IMPROVING COPPER FILL INTEGRITY

(75) Inventors: Chao-Cheng Chen, Tsu-Tory; Jen-Cheng Liu, Chia-Yih; Jyu-Horng Shieh; Chia-Shiung Tsai, both of Hsin-Chu; Bor-Shyang Lin, Feng-Sun, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/687,160

(22) Filed: Oct. 16, 2000

(51) Int. Cl.⁷ ............................................. H01L 21/302
(52) U.S. Cl. ........................................ 438/723; 438/724
(58) Field of Search ................................. 438/691, 692, 438/693, 706, 710, 720, 723, 724

(56) References Cited

U.S. PATENT DOCUMENTS

| | | | |
|---|---|---|---|
| 4,519,872 A | 5/1985 | Anderson, Jr. et al. ..... | 156/643 |
| 5,512,514 A | 4/1996 | Lee ............................ | 437/195 |
| 5,654,232 A | 8/1997 | Gardner ....................... | 438/661 |
| 5,691,238 A | 11/1997 | Avanzino et al. ........... | 437/195 |
| 5,693,568 A | 12/1997 | Liu et al. .................... | 437/195 |
| 5,846,876 A | 12/1998 | Bandyopadhyay et al. . | 438/622 |
| 5,998,253 A * | 12/1999 | Loh et al. ................... | 438/243 |
| 6,010,962 A | 1/2000 | Liu et al. .................... | 438/687 |
| 6,054,398 A | 4/2000 | Pramanick ................... | 438/784 |
| 6,228,701 B1 * | 5/2001 | Dehm et al. ................ | 438/240 |

* cited by examiner

Primary Examiner—Benjamin L. Utech
Assistant Examiner—Kin-Chan Chen
(74) Attorney, Agent, or Firm—George O. Saile; Stephen B. Ackerman; Rosemary L.S. Pike

(57) ABSTRACT

A method for eliminating the problems associated with the discontinuous deposition of the glue layer at the bottom of the via resulting from the notch in the silicon nitride etch stop layer. First conductive layer traces are patterned and a silicon nitride (SiN) etch stop layer is provided overlying the first conductive layer. An inter-metal dielectric (IMD) layer then overlies the entire surface. An anisotropic etch is performed leaving via holes in the IMD layer. This is followed by a second anisotropic etch step to remove the etch stop layer not protected by the IMD layer resulting in the formation a notch at the bottom of the via hole. An important step of the present invention is the elimination of this notch accomplished by nitridizing the surface of the IMD layer. A wet polymer cleaning is performed to remove the nitridized IMD surface and eliminating the notch. A glue layer is conformally applied lining the via hole. A second conductive layer is then deposited and the surface is planarized.

30 Claims, 5 Drawing Sheets

PROCESS FOR IMPROVING COPPER FILL INTEGRITY

BACKGROUND OF THE INVENTION (1) Field of the Invention

The invention generally relates to an interconnection process used in semiconductor manufacturing and, more particularly, to a method for improving the reliability of connections between different layers of metal or conducting material in the fabrication of integrated circuits.

(2) Description of Prior Art

To improve the device speed of logic on sub-quarter micron semiconductor circuits, copper has gained popularity as an interconnect material. This takes advantage of the copper's low electrical resistivity and superior resistance to electro-migration. In circuit employing multi-level interconnection, vias are used to connect the different conducting levels. The vias must provide reliable, low resistance interconnection between the conducting levels.

Referring now to FIG. 1, a typical via process is depicted in cross-section. A substrate layer 10 is provided. The substrate layer 10 may contain underlying layers, devices, junctions, and other features covered by an insulating layer formed prior to deposition and patterning of the first conductive layer 12. A silicon nitride (SiN) etch stop layer 14 is provided overlying the first conductive layer 12. An inter-metal dielectric (IMD) layer 16 overlies the entire surface. An anisotropic etch is performed leaving via holes 18 in the IMD layer 16. Referring now to FIG. 2, a second etch step is performed to remove the etch stop layer 14 not protected by the IMD) layer thereby extending the via holes 18 to the first conductive layer 12. Because of the etch selectivity of the SiN etch stop layer 14 over the IMD layer 16, a notch profile 19 results as shown at the bottom of the via hole 18 as shown in FIG. 2.

Referring now to FIG. 3, a conductive glue layer 20 composed of tantalum nitride (TaN) is applied to the surface of the wafer, lining the via holes 18. Thereafter a second conductive layer 22 such as copper is deposited on the surface of the wafer, filling the via holes 18. The notch at the base of the via hole 18 causes discontinuous deposition of the conductive glue layer 20 and may result in an open or poor electrical connection between the first conductive layer 12 and the second conductive layer 22. As shown in FIG. 4, chemical mechanical polishing (CMP) is used to planarize the surface exposing the top of the IMD layer 16 and completing the via structure.

The prior art shown above illustrates the difficulty in etching vias. Incomplete clearing of etch by-product residue at the bottom of narrow trenches and the formation of the notch profile may result in poor or open connections between the via metal and the first conductive layer. These problems may be exaggerated by the fact that etch rates increase in areas where via density is higher.

Other approaches improving interconnections exist. U.S. Patent No. 6,010,962 to Lui et al. teaches a method where a glue layer is deposited in a via hole followed by a thin seed copper layer. The via hole is filled with photoresist to keep contaminants from entering during CMP planarization. After CMP the photoresist is removed by dry ashing and. electro-less plating is incorporated to fill the via hole with copper. U.S. Patent No. 6,054,398 to Pramanick teaches a method for using low-K fluorinated dielectrics in interconnection. Tantalum (Ta) is first conformally deposited in a carbon or silicon ambient to form a carbide or silicide along the sidewalls of the via hole. This suppresses the reaction between the Ta and the low-K fluorinated dielectrics. Thereafter the glue layer of Ta or tantalum nitride (TaN) can be applied to line the via hole which is then filled with copper. U.S. Pat. No. 5,654,232 to Gardner teaches a method using silicon nitride (SiN) as a via hole liner. Copper is sputtered onto the surface filling the via hole. While maintaining the vacuum from sputtering, the copper is reflowed and oxidation of the copper surface is avoided. U.S. Pat. No. 4,519,872 to Anderson, Jr. et al. teaches a method using polymers to create lift-off structures in the formation of multiple level interconnections. U.S. Patent No. 5,512,514 to Lee teaches a method of using pillars in the creation of vias in multilevel metalization. U.S. Patent No. 5,691,238 to Avanzino et al teaches a method using a dual and triple damascene process whereby pillars are created to complete interlevel connection. U.S. Patent No. 5,693,568 to Liu et al. teaches a method using two conductive layers with a conductive etch stop layer between them. First all three layers are selectively etched to form the pattern for the lower conductors. The openings between the conductors are then filled with a dielectric. The upper conductive layer is then patterned and etched to form the interlevel vias. The openings in the upper conductive layer are then filled and the wafer surface covered with dielectric. The surface is planarized exposing the tops of the upper conductive layer. This process is repeated to form multiple levels of interconnection. U.S. Pat. No. 5,846,876 to Bandyapadhyay et al. teaches a method using multiple conductive levels to reduce conductor spacing while avoiding problems of increased capacitance.

SUMMARY OF THE INVENTION

A principal object of the present invention is to provide a process that allows the formation of reliable interlevel conductor connection.

Another object of the present invention is to provide a process that allows the formation of reliable interlevel conductor connection by eliminating the problems associated with the discontinuous deposition of the glue layer at the bottom of the via resulting from the notch in the silicon nitride etch stop layer.

These objects are achieved by using a process where a substrate layer is provided containing underlying layers, devices, junctions, and other features covered by an insulating layer. First conductive layer traces are patterned and a silicon nitride (SiN) etch stop layer is provided overlying the first conductive layer. An inter-metal dielectric (IMD) layer overlies the entire surface. An anisotropic etch is performed leaving via holes in the IMD layer followed by a second anisotropic etch step to remove the etch stop layer not protected by the ID layer. This results in the formation of the notch profile described in the prior art. An ammonia ($NH_3$), nitrogen/hydrogen ($N_2/H_2$) or $N_2$ plasma treatment is performed to nitridize the dielectric surfaces. A wet polymer process cleaning is performed which removes the nitridized surface of the dielectric layer thereby eliminating the notch. The process then continues as described in the prior art.

BRIEF DESCRIPTION OF THE DRAWINGS

In the accompanying drawings forming a material part of this description, there is shown.

DESCRIPTION OF THE PREFERRED EMBODIMENTS

Figure 1:
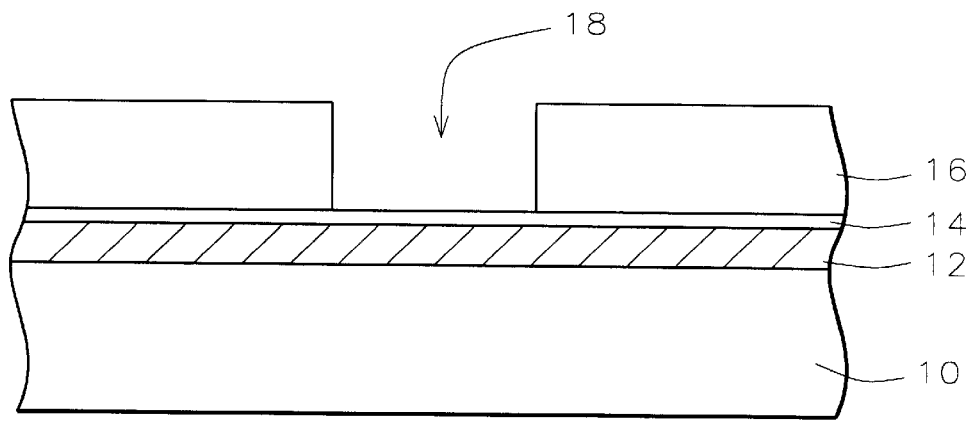
FIGS. 1 through 4 schematically illustrating in cross-sectional representation a prior art example of the via process.
Figure 2:
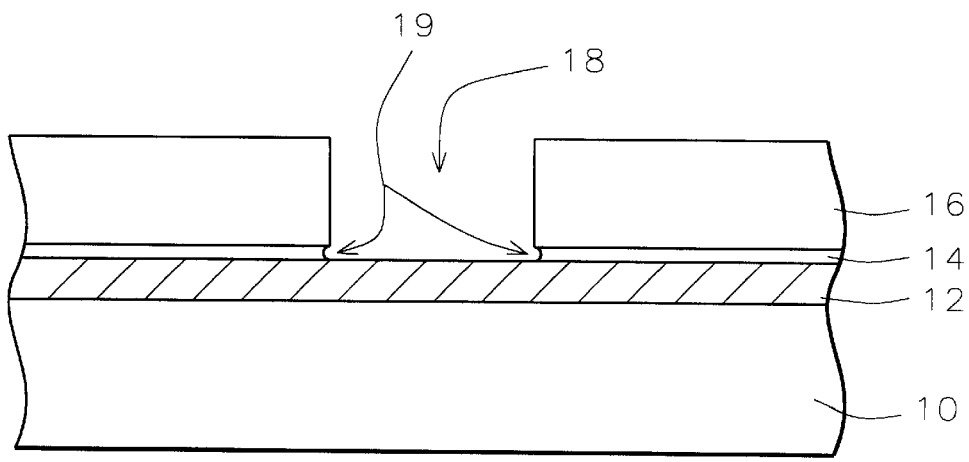
Figure 3:
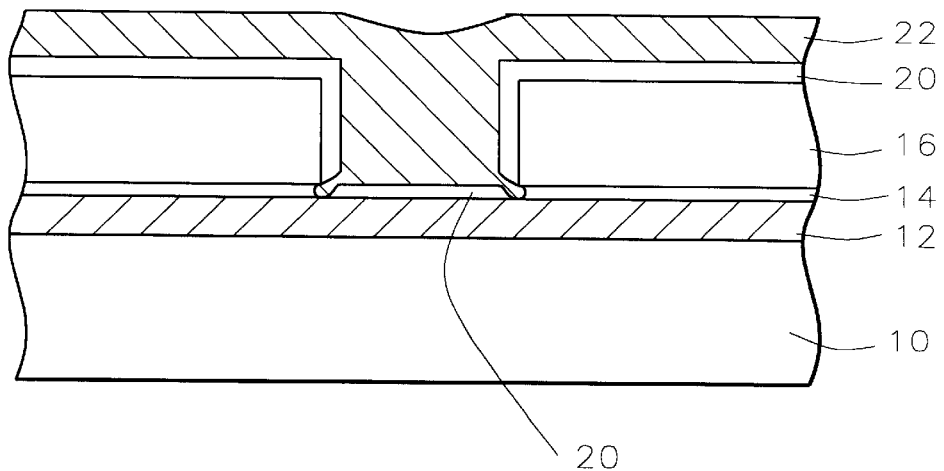
Figure 4:
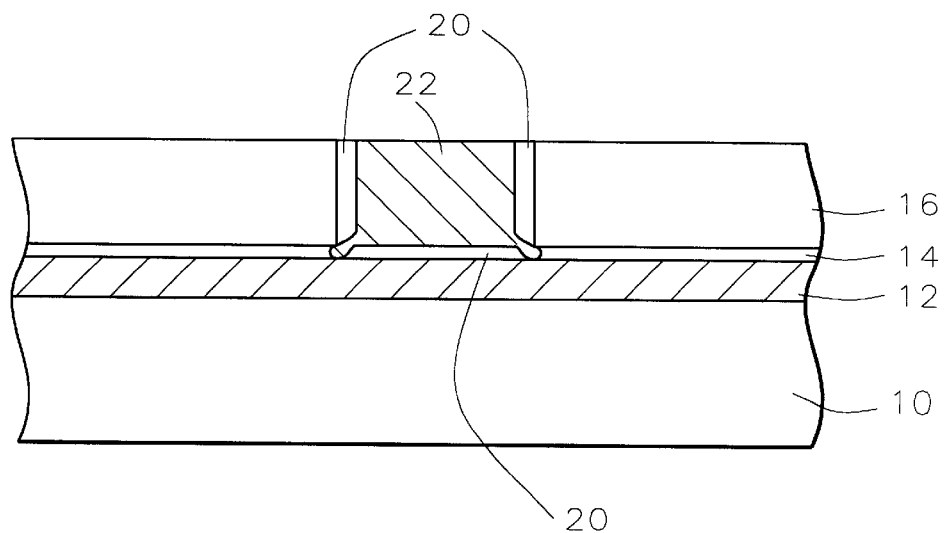
Figure 5:
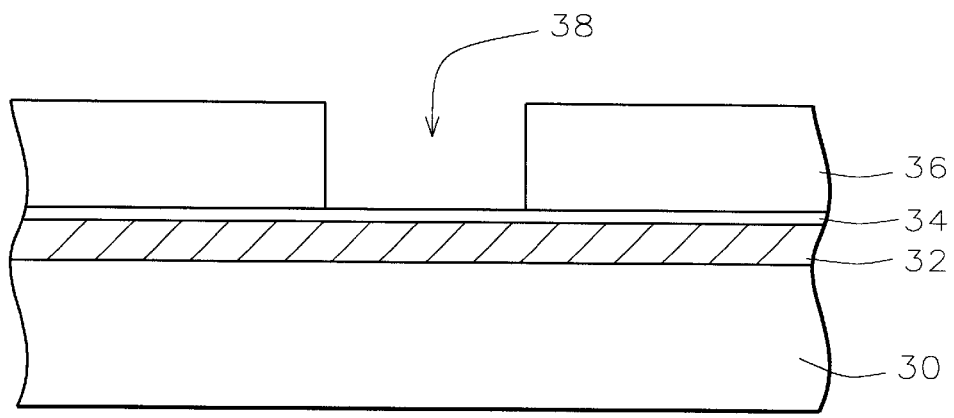
FIGS. 5 through 10 schematically illustrating in cross-sectional representation a preferred embodiment of the present invention.

Referring now to FIG. 5, a substrate 30 is provided. The substrate layer 30 may contain underlying layers, devices, junctions, and other features formed in earlier process steps covered by an insulating layer. A first conductive layer 32 composed of a conductor from a group containing aluminum, copper (preferable), gold or alloys of aluminum, copper and/or gold overlies the substrate 30. The first conductive layer 32 is deposited by copper electrochemical deposition (ECD) followed by planarization using chemical mechanical polishing (CMP) to yield a thickness of between about 2,500 to 4,000 Angstroms. This is followed by a etch stop layer 34 deposition composed of silicon nitride (SiN) or silicon carbide (SiC) by chemical vapor deposition (CVD) to a thickness of between about 300 to 800 Angstroms. An IMD layer 36 composed of undoped silicate glass (USG), fluorinated silicate glass (FSG) or other oxide based materials is deposited by CVD to a thickness of between about 6,000 to 20,000 Angstroms. The IMD layer 36 is then patterned and anisotropically etched to form via hole 38. This is achieved by dry etching with a chemistry comprised of one or more from a list containing $CF_4$, $C_2F_6$, $C_4F_8$, $N_2$ and $O_2$ at a pressure of between about 40 to 100mT and a power of between 500 to 1,500 watts.

Figure 6:
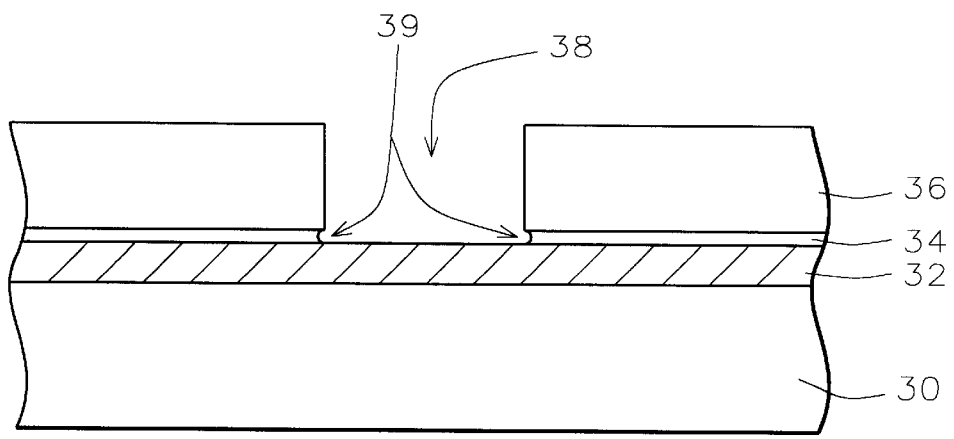

Referring now to FIG. 6, the etch stop layer 34 is etched in the area not protected by the IMD layer 36 thereby extending via hole 38. This is accomplished by dry etching with a chemistry comprised of one or more from a list containing $CF_4$, $C_2F_6$, $CHF_3$, $C_4F_8$, $N_2$ and $O_2$ at a pressure of between about 40 to 100mT and a power of between 200 to 1,000 watts. As described in the prior art, this results in the formation of a notch 39 in the etch stop layer 34.

Figure 7:
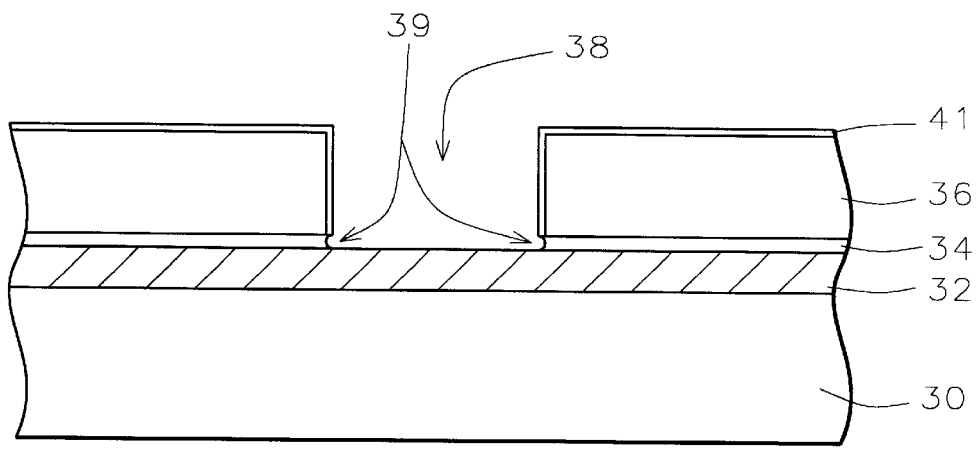

Referring now to FIG. 7, depicting an important step in the present invention. A plasma treatment using ammonia ($NH_3$), nitrogen/hydrogen ($N_2/H_2$) or $N_2$ is performed at a temperature of between about 200 to 450° C., a flow rate of between about 500 to 5,000 sccm, a pressure of between about 0.5 to 5 Torr for 20 to 60 minutes. This step is to nitridize the IMD surface above the notch 39 yielding a SiNO layer 41. The notch 39 is protected from the plasma treatment and is therefore less treated.

Figure 8:
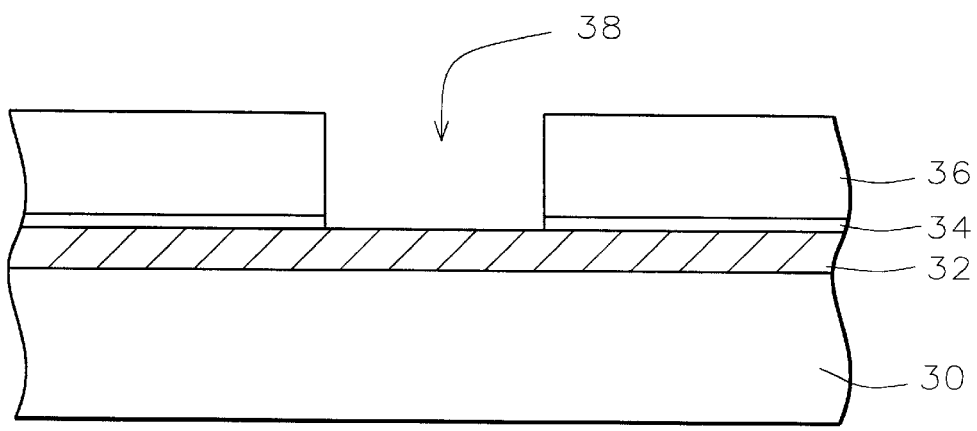

Referring now to FIG. 8, the SiNO layer 41 is subsequently removed by a polymer wet cleaning using a copper compatible solvent at a temperature of between about 25 to 110° C. for 10 to 30 minutes. Since the notch 39 is not nitridized, when the SiNO layer 41 above the notch 39 is removed, the un-nitridized notch 39 will disappear.

Figure 9:
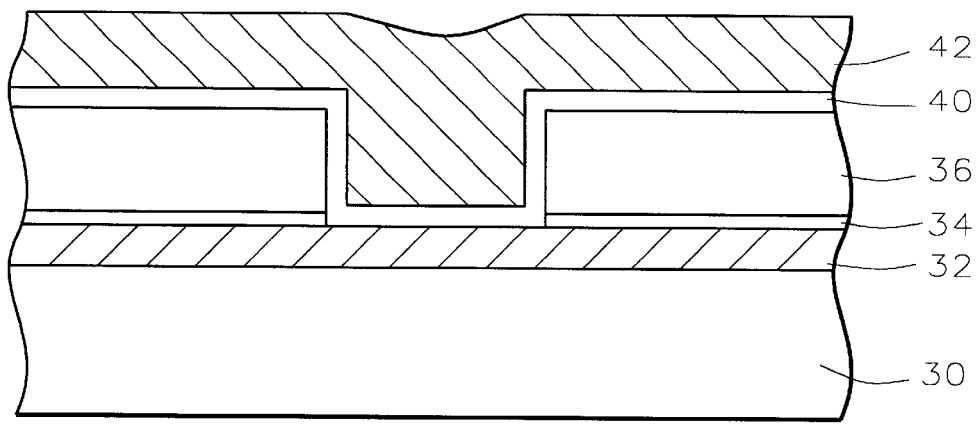

The process continues as described in prior art. Referring now to FIG. 9, a glue layer 40 composed of one from a list containing tantalum (Ta), tantalum nitride (TaN), or titanium nitride (TiN) is deposited by physical vapor deposition (PVD) to a thickness of between about 100 to 600 Angstroms. A second conductive layer 42 composed of one from a group containing aluminum, copper (preferable), gold or alloys of aluminum, copper and/or gold is deposited covering the surface and filling via hole 38. The second conductive layer 42 is deposited by ECD to a thickness of between about 3,000 to 10,000 Angstroms, depending upon the thickness of the IMD layer 36.

Figure 10:
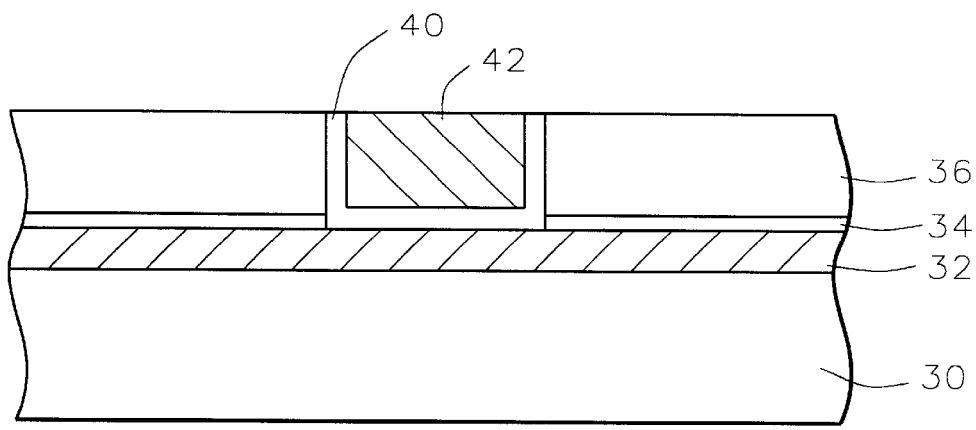

Referring now to FIG. 10, the via structure is completed by planarization using chemical mechanical polishing, for example, to remove the second conductive layer 42 and glue layer 40 not contained by the via hole 38.

The present invention provides a process that allows the formation of reliable interlevel conductor connection by eliminating the problems associated with the discontinuous deposition of the glue layer at the bottom. This is accomplished by the addition of a plasma treatment and surface cleaning which eliminates the notch created during etching of the silicon nitride etch stop layer. This provides for uniform deposition of the glue layer thereby eliminating problems of agglomeration of the second conductive layer during annealing. The result is a reliable, low resistance via contact.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit via interconnection comprising:

providing an insulating layer overlying semiconductor device structures in and on a semiconductor substrate;

depositing a first conductive layer overlying said insulating layer;

depositing an etch stop layer overlying said first conductive layer;

depositing a dielectric layer overlying said etch stop layer;

anisotropically etching said dielectric layer to form openings to said etch stop layer;

etching said etch stop layer not protected by said dielectric layer thereby extending said openings to said first conductive layer whereby a notch is formed in said etch stop layer;

nitridizing said dielectric layer surface;

thereafter removing said nitridized dielectric layer surface whereby said notch is eliminated;

conformally depositing a glue layer overlying said dielectric layer and lining said openings;

depositing a second conductive layer overlying said glue layer and filling said openings; and planarizing said second conductive layer and said glue layer to expose the top of said dielectric layer to complete fabrication of said integrated circuit via interconnection.

2. The method according to claim 1 wherein said first conductive layer is selected from the group consisting of aluminum, copper, gold or alloys of aluminum, copper and gold deposited by electro-chemical deposition at a thickness of between about 2,500 to 4,000 Angstroms.

3. The method according to claim 1 wherein said etch stop layer is selected from the group consisting of silicon nitride and silicon carbide deposited by chemical vapor deposition at a thickness of between about 300 to 800 Angstroms.

4. The method according to claim 1 wherein said dielectric layer is selected from the group consisting of undoped silicate glass, fluorinated silicate glass and other oxide based materials deposited by chemical vapor deposition at a thickness of between about 6,000 to 20,000 Angstroms.

5. The method according to claim 1 wherein said anisotropic etching of said dielectric layer is accomplished by dry etching using a chemistry selecting from the group consisting of $CF_4$, $C_2F_6$, $CHF_3$, $C_4F_8$, $N_2$ $O_2$, and combinations thereof at a pressure of between about 40 to 100 mT and a power of between 500 to 1,500 watts.

6. The method according to claim 1 wherein said etching of said etch stop layer is accomplished by dry etching using a chemistry selected from the group consisting of $CF_4$, $C_2F_6$, $CHF_3$, $C_4F_8$, $N_2$ $O_2$, and combinations thereof at a pressure of between 40 to 100 mT and a power of between 200 to 1,000 watts.

7. The method according to claim 1 wherein said nitridizing of said dielectric layer surface is accomplished by plasma treatment using ammonia, hydrogen/nitrogen or $N_2$ at a temperature of between about 200 to 450° C., a flow rate of between about 500 to 5,000 sccm, and pressure of between about 0.5 to 5 Torr for between about 20 to 60 minutes.

8. The method according to claim 1 wherein said removal of said nitridized dielectric layer surface is accomplished by wet polymer treatment using a copper compatible solvent at between about 25 to 110° C. for 10 to 30 minutes.

9. The method according to claim 1 wherein said glue layer is selected from the group consisting of tantalum, tantalum nitride, and titanium nitride deposited by physical vapor deposition at a thickness of between about 100 to 600 Angstroms.

10. The method according to claim 1 wherein said second conductive layer is selected from the group the group consisting of aluminum, copper, gold or alloys of aluminum, copper, and gold deposited by electrochemical deposition at a thickness of between about 3,000 to 10,000 Angstroms.

11. A method of fabricating an integrated circuit via interconnection comprising;
providing an insulating layer overlying semiconductor device structures in and on a semiconductor substrate;
depositing a first conductive layer overlying said insulating layer;
depositing an etch stop layer overlying said first conductive layer;
depositing a dielectric layer overlying said etch stop layer;
anisotropically etching said dielectric layer to form openings to said etch stop layer;
etching said etch stop layer not protected by said dielectric layer extending said openings to said first conductive layer whereby a notch is formed in said etch stop layer;
nitridizing said dielectric layer surface;
cleaning said openings using a wet chemical clean whereby said nitridized dielectric layer surface is removed thereby eliminating said notch in said etch stop layer;
conformally depositing a glue layer overlying said dielectric layer and lining said openings;
depositing a second conductive layer overlying said glue layer and filling said openings; and
planarzing said second conductive layer and said glue layer to expose the top of said dielectric layer to complete fabrication of said integrated circuit via interconnection.

12. The method according to claim 11 wherein said first conductive layer is selected from the group consisting of aluminum, copper, gold or alloys of aluminum, copper and gold deposited by electro-chemical deposition at a thickness of between about 2,500 to 4,000 Angstroms.

13. The method according to claim 11 wherein said etch stop layer is selected from the group consisting of silicon nitride and silicon carbide deposited by chemical vapor deposition at a thickness of between about 300 to 800 Angstroms.

14. The method according to claim 11 wherein said dielectric layer is selected from the group consisting of undoped silicate glass, fluorinated silicate glass and other oxide based materials deposited by chemical vapor deposition at a thickness of between about 6,000 to 20,000 Angstroms.

15. The method according to claim 11 wherein said anisotropic etching of said dielectric layer is accomplished by dry etching using a chemistry selected from the group consisting of $CF_4$, $C_2F_6$, $CHF_3$, $C_4F_8$, $N_2$ $O_2$, and combinations thereof at a pressure of between about 40 to 100 mT and a power of between 500 to 1,500 watts.

16. The method according to claim 11 wherein said etching of said etch stop layer is accomplished by dry etching using a chemistry selected from the group consisting of $CF_4$, $C_2F_6$, $CHF_3$, $C_4F_8$, $N_2$ $O_2$, and combination there of at a pressure of between about 40 to 100 mT and a power of between 200 to 1,000 watts.

17. The method according to claim 11 wherein said nitridizing of said dielectric layer surface is accomplished by plasma treatment using ammonia, hydrogen/nitrogen or $N_2$ at a temperature of between about 200 to 450° C., a flow rate of between about 500 to 5,000 sccm, and pressure of between about 0.5 to 5 Torr for between about 20 to 60 minutes.

18. The method according to claim 11 wherein said wet chemical clean uses a copper compatible solvent at between about 25 to 110° C. for 10 to 30 minutes.

19. The method according to claim 11 wherein said second conductive layer is selected from the group consisting of aluminum, copper, gold or alloys of aluminum, copper, and gold deposited by electro-chemical deposition at a thickness of between about 3,000 to 10,000 Angstroms.

20. The method according to claim 11 wherein said glue layer is selected from the group consisting of tantalum, tantalum nitride, and titanium nitride deposited by physical vapor deposition at a thickness of between about 100 to 600 Angstroms.

21. A method of fabricating an integrated circuit via interconnection comprising:
providing an insulating layer overlying semiconductor device structures in and on a semiconductor substrate;
depositing a first conductive layer overlying said insulating layer;
depositing an etch stop layer overlying said first conductive layer;
depositing a dielectric layer overlying said etch stop layer;
anisotropically etching said dielectric layer to form openings to said etch stop layer;
etching said etch stop layer not protected by said dielectric layer extending said openings to said first conductive layer whereby a notch is formed in said etch stop layer;
nitridizing said dielectric layer surface by plasma treatment with one of a group containing ammonia, hydrogen/nitrogen or $N_2$;
cleaning said openings using a wet chemical clean whereby said nitridized dielectric layer surface is removed thereby eliminating said notch in said etch stop layer;
conformally depositing a glue layer overlying said dielectric layer and lining said openings;
depositing a second conductive layer overlying said glue layer and filling said openings; and
planarizing said second conductive layer and said glue layer to expose the top of said dielectric layer to complete fabrication of said integrated circuit via interconnection.

22. The method according to claim 21 wherein said first conductive layer is selected from the group consisting of aluminum, copper, gold or alloys of aluminum, copper and gold deposited by electro-chemical deposition at a thickness of between about 2,500 to 4,000 Angstroms.

23. The method according to claim 21 wherein said etch stop layer is selected from the group consisting of silicon nitride and silicon carbide deposited by chemical vapor deposition at a thickness of between about 300 to 800 Angstroms.

24. The method according to claim 21 wherein said dielectric layer is selected from the group consisting of undoped silicate glass, fluorinated silicate glass and other oxide based materials deposited by chemical vapor deposition at a thickness of between about 6,000 to 20,000 Angstroms.

25. The method according to claim 21 wherein said anisotropic etching of said dielectric layer is accomplished by dry etching using a chemistry selected from the group consisting of $CF_4$, $C_2F_6$, $CHF_3$, $C_4F_8$, $N_2$ $O_2$, and combinations thereof of between about 40 to 100 mT and a power of between 500 to 1,500 watts.

26. The method according to claim 21 wherein said etching of said etch stop layer is accomplished by dry etching using a chemistry selected from the group consisting of $CF_4$, $C_2F_6$, $CHF_3$, $C_4F_8$, $N_2$ $O_2$, and combinations thereof at a pressure of between about 40 to 100 mT and a power of between 200 to 1,000 watts.

27. The method according to claim 21 wherein said plasma treatment is performed using a temperature of between about 200 to 450° C., a flow rate of between about 500 to 5,000 sccm, and pressure of between about 0.5 to 5 Torr for between about 20 to 60 minutes.

28. The method according to claim 21 wherein said wet chemical clean uses a copper compatible solvent at between about 25 to 110° C. for 10 to 30 minutes.

29. The method according to claim 21 wherein said second conductive layer is selected from the group consisting of aluminun copper, gold or alloys of aluminum, copper, and gold deposited by electro-chemical deposition at a thickness of between about 3,000 to 10,000 Angstroms.

30. The method according to claim 21 wherein said glue layer is selected from the group consisting of tantalum, tantalum nitride, and titanium nitride deposited by physical vapor deposition at a thickness of between about 100 to 600 Angstroms.

* * * * *